(12) United States Patent
He et al.

(10) Patent No.: US 7,598,166 B2
(45) Date of Patent: Oct. 6, 2009

(54) DIELECTRIC LAYERS FOR METAL LINES IN SEMICONDUCTOR CHIPS

(75) Inventors: Zhong-Xiang He, Essex Junction, VT (US); Ning Lu, Essex Junction, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 11/530,116

(22) Filed: Sep. 8, 2006

(65) Prior Publication Data

US 2008/0061403 A1    Mar. 13, 2008

(51) Int. Cl.
*H01L 21/4763* (2006.01)

(52) U.S. Cl. .................. 438/618; 438/619; 438/622; 438/623; 438/687; 438/781; 257/E21.273; 257/E21.293; 257/E21.576; 257/E21.581; 257/E23.144; 257/E23.161; 257/E23.167

(58) Field of Classification Search ......... 438/618–623, 438/627, 687, 702, 781; 257/E21.273, 293, 257/576, 581, E23.144, 161, 167
See application file for complete search history.

(56) References Cited

U.S. PATENT DOCUMENTS

| 6,159,842 | A  | * | 12/2000 | Chang et al. | 438/622 |
| 6,486,077 | B2 | * | 11/2002 | Sato         | 438/763 |
| 6,518,130 | B1 | * | 2/2003  | Ohno         | 438/275 |
| 6,958,524 | B2 | * | 10/2005 | Li et al.    | 257/635 |
| 7,153,766 | B2 | * | 12/2006 | Zhang et al. | 438/627 |

* cited by examiner

*Primary Examiner*—Michael S Lebentritt
(74) *Attorney, Agent, or Firm*—Schmeiser, Olsen & Watts; William D. Sabo

(57) ABSTRACT

A semiconductor structure and methods for forming the same. The structure includes (a) a substrate; (b) a first device and a second device each being on the substrate; (c) a device cap dielectric layer on the first and second devices and the substrate, wherein the device cap dielectric layer comprises a device cap dielectric material; (d) a first dielectric layer on top of the device cap dielectric layer, wherein the first dielectric layer comprises a first dielectric material; (e) a second dielectric layer on top of the first dielectric layer; and (f) a first electrically conductive line and a second electrically conductive line each residing in the first and second dielectric layers. The first dielectric layer physically separates the first and second electrically conductive lines from the device cap dielectric layer. A dielectric constant of the first dielectric material is less than that of the device cap dielectric material.

20 Claims, 4 Drawing Sheets

US 7,598,166 B2

DIELECTRIC LAYERS FOR METAL LINES IN SEMICONDUCTOR CHIPS

FIELD OF THE INVENTION

The present invention relates to dielectric layers separating metal lines, and more specifically, to dielectric layers separating M1 lines (i.e., metal lines in the first metal level).

BACKGROUND OF THE INVENTION

In a conventional semiconductor chip, the M1 lines are very closely situated. As a result, line-to-line coupling capacitance between the M1 lines is very high. Therefore, there is a need for a structure (and a method for forming the same), in which the line-to-line coupling capacitance between the M1 lines is reduced compared to the prior art.

SUMMARY OF THE INVENTION

The present invention provides a semiconductor structure, comprising (a) a substrate; (b) a first device and a second device each being on the substrate; (c) a device cap dielectric layer on top of the first and second devices and on top of the substrate, wherein the device cap dielectric layer comprises a device cap dielectric material; (d) a first dielectric layer on top of the device cap dielectric layer, wherein the first dielectric layer comprises a first dielectric material; (e) a second dielectric layer on top of the first dielectric layer, wherein the second dielectric layer comprises a second dielectric material; and (f) a first electrically conductive line and a second electrically conductive line each residing in the first and second dielectric layers, wherein the first dielectric layer physically separates the first and second electrically conductive lines from the device cap dielectric layer, and wherein a dielectric constant of the first dielectric material is less than a dielectric constant of the device cap dielectric material.

The present invention provides a semiconductor structure fabrication method, comprising providing a semiconductor structure which includes (a) a substrate, (b) a first device and a second device each being on the substrate, (c) a device cap dielectric layer on top of the first and second devices and on top of the substrate, wherein the device cap dielectric layer comprises a device cap dielectric material, (d) a first dielectric layer on top of the device cap dielectric layer, wherein the first dielectric layer comprises a first dielectric material, and (e) a second dielectric layer on top of the first dielectric layer, wherein the second dielectric layer comprises a second dielectric material; and forming a first electrically conductive line and a second electrically conductive line each residing in the first and second dielectric layers, wherein the first dielectric layer physically separates the first and second electrically conductive lines from the device cap dielectric layer, and wherein a dielectric constant of the first dielectric material is less than a dielectric constant of the device cap dielectric material.

The present invention provides a structure (and a method for forming the same), in which the line-to-line coupling capacitance between the M1 lines is reduced compared to the prior art.

DETAILED DESCRIPTION OF THE INVENTION

FIGS. 1A-1I illustrate (cross-section views) a fabrication method for forming a semiconductor structure 100, in accordance with embodiments of the present invention. More specifically, with reference to FIG. 1A, in one embodiment, the fabrication of the semiconductor structure 100 starts out with a semiconductor substrate 110. Illustratively, the semiconductor substrate 110 comprises a semiconductor material such as silicon (Si), germanium (Ge), silicon germanium (SiGe), silicon carbide (SiC), and those materials consisting essentially of one or more compound semiconductors such as gallium arsenic (GaAs), gallium nitride (GaN), and indium phosphoride (InP), etc.

Figure 1A:
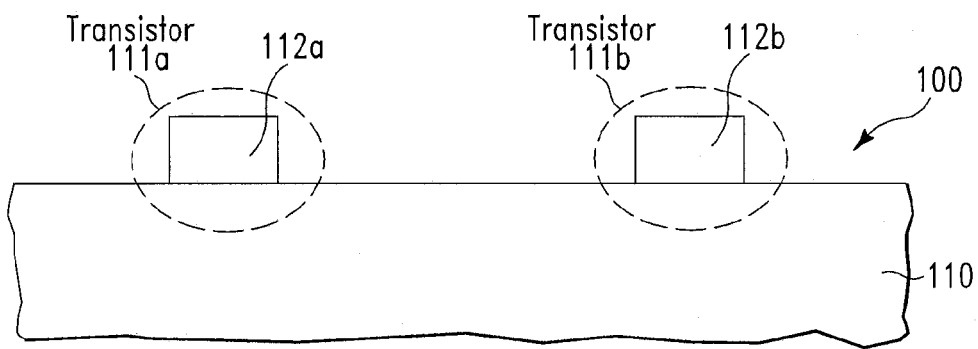
FIGS. 1A-1I illustrate (cross-section views) a fabrication method for forming a first semiconductor structure, in accordance with embodiments of the present invention.

Next, in one embodiment, transistors 111a and 111b are formed on the semiconductor substrate 110 by using a conventional method. For simplicity, only gate electrode regions 112a and 112b of the transistors 111a and 111b, respectively, are shown in FIG. 1A. In one embodiment, the gate electrode regions 112a and 112b comprise an electrically conductive material such as polysilicon.

Figure 1B:
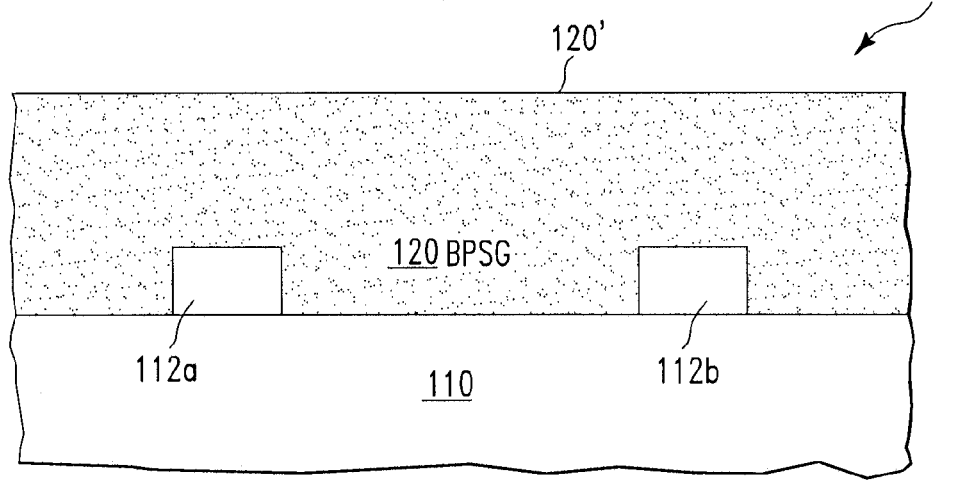

Next, with reference to FIG. 1B, in one embodiment, a device cap dielectric layer 120 is formed on top of the entire structure 100 of FIG. 1A. In one embodiment, the device cap dielectric layer 120 can be formed by CVD (Chemical Vapor Deposition) of a dielectric material on top of the entire structure 100 of FIG. 1A, and then a top surface 120' of the device cap dielectric layer 120 can be planarized by, illustratively, a CMP (Chemical Mechanical Polishing) step. In one embodiment, the dielectric material used to form the device cap dielectric layer 120 can be BPSG (Boro-Phospho-Silicate Glass).

Figure 1C:
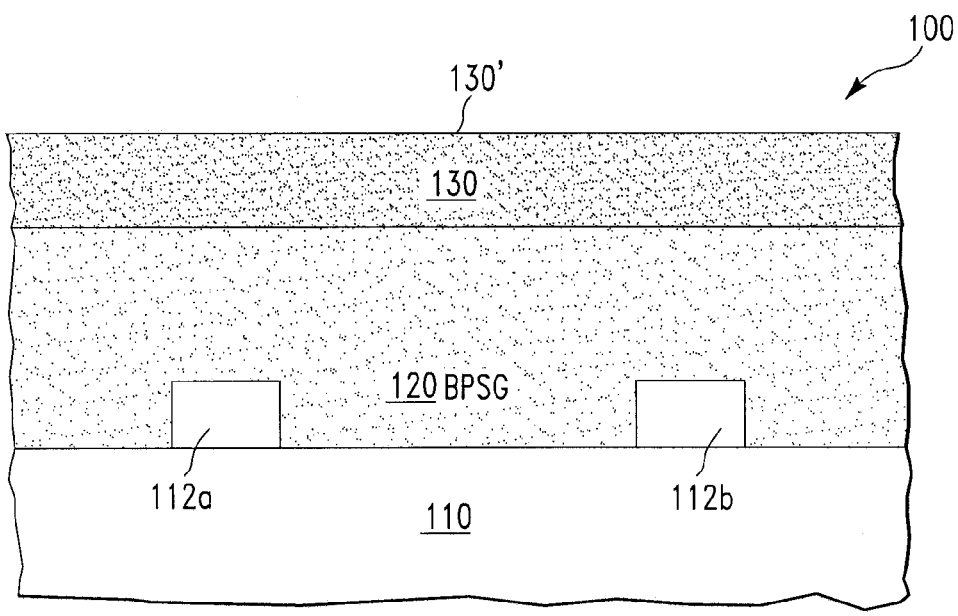

Next, with reference to FIG. 1C, in one embodiment, a first low-k dielectric layer 130 is formed on top of the device cap dielectric layer 120, wherein k is dielectric constant and "low-k" means k is less than 4.0. In one embodiment, the first low-k dielectric layer 130 can be formed by CVD of a first low-k dielectric material on top of the device cap dielectric layer 120. In one embodiment, the first low-k dielectric material used to form the first low-k dielectric layer 130 can be FSG (Fluorine-doped Silicate Glass), whose k is 3.6; Bulk SiCOH (carbon-doped silicon oxides), whose k is 3.0; and/or Porous SiCOH, whose k is 2.3; etc. In one embodiment, the dielectric constant of the first low-k dielectric material which is used to form the first low-k dielectric layer 130 is lower than the dielectric constant of the dielectric material used to form the device cap dielectric layer 120.

Figure 1D:
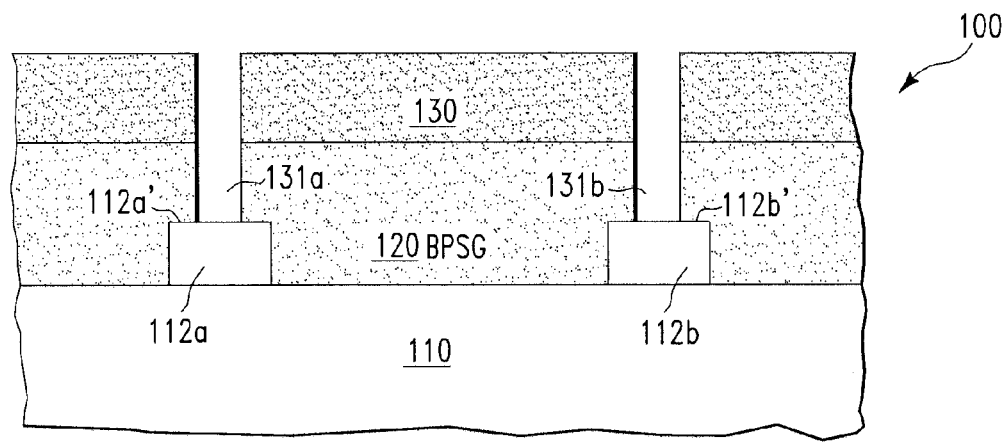

Next, with reference to FIG. 1D, in one embodiment, holes 131a and 131b are formed in the first low-k dielectric layer 130 and the device cap dielectric layer 120. In one embodiment, the holes 131a and 131b are formed using a conventional lithography and etching process. In one embodiment, the etching process to form the holes 131a and 131b essentially stops at the gate electrode regions 112a and 112b and exposes top surfaces 112a' and 112b' of the gate electrode regions 112a and 112b, respectively, to the surrounding ambient through the holes 131a and 131b, respectively.

Figure 1E:
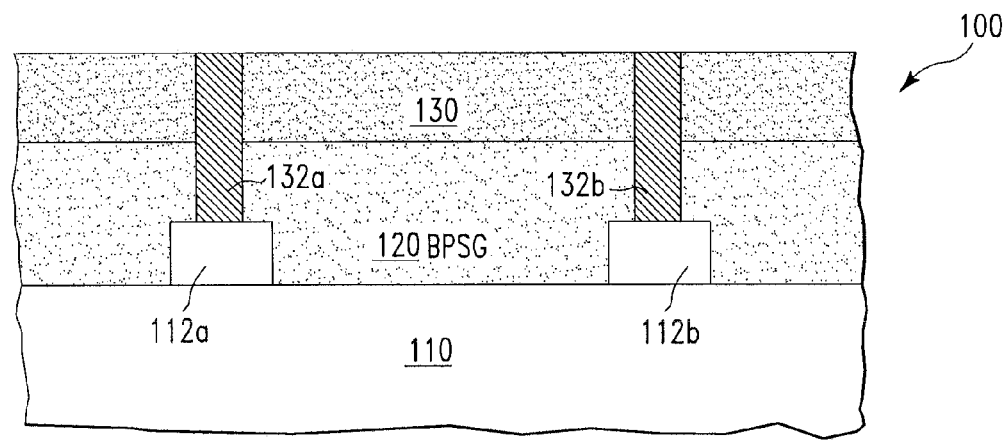

Next, in one embodiment, the holes 131a and 131b are filled with a first electrically conductive material so as to form contact regions 132a and 132b, respectively, resulting in the structure 100 of FIG. 1E. In one embodiment, with reference to FIGS. 1D and 1E, the contact regions 132a and 132b are formed by depositing the first electrically conductive material on top of the entire structure 100 of FIG. 1D (including in the holes 131*a* and 131*b*), and then polishing by a CMP step to remove excessive material outside the holes 131*a* and 131*b*. As a result, the contact regions 132*a* and 132*b* are electrically coupled to the gate electrode regions 112*a* and 112*b*, respectively. In one embodiment, the first electrically conductive material used to form the contact regions 132*a* and 132*b* can be tungsten.

Figure 1F:
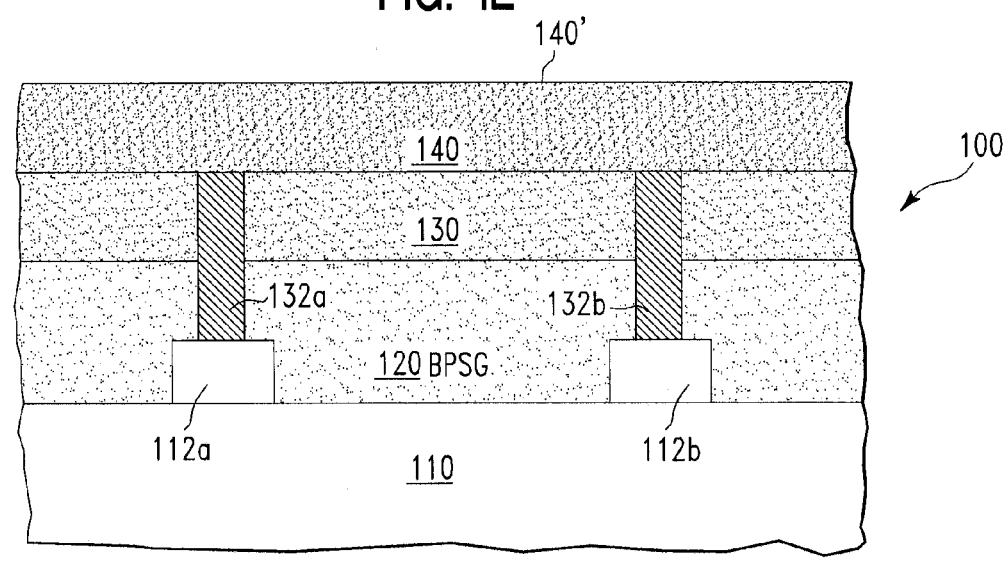

Next, with reference to FIG. 1F, in one embodiment, a second low-k dielectric layer 140 is formed on top of the entire structure 100 of FIG. 1E, wherein k is less than 4.0. In one embodiment, the second low-k dielectric layer 140 can be formed by CVD of a second low-k dielectric material on top of the entire structure 100 of FIG. 1E. In one embodiment, the second low-k dielectric material used to form the second low-k dielectric layer 140 can be FSG, whose k is 3.6; Bulk SiCOH, whose k is 3.0; and/or Porous SiCOH, whose k is 2.3; etc. In one embodiment, the dielectric constant of the second low-k dielectric material and the dielectric constant of the first low-k dielectric material can be the same. In an alternative embodiment, the dielectric constant of the second low-k dielectric material can be greater or lower than the dielectric constant of the first low-k dielectric material, which is used to form the first low-k dielectric layer 130.

Figure 1G:
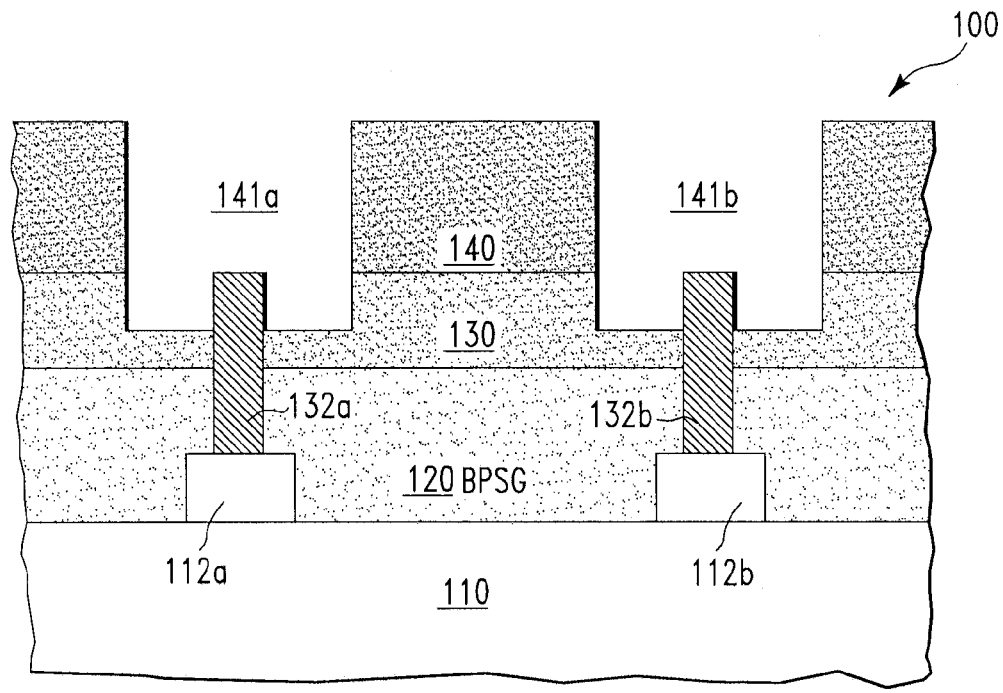

Next, with reference to FIG. 1G, in one embodiment, trenches 141*a* and 141*b* are formed in the first low-k dielectric layer 130 and the second low-k dielectric layer 140. In one embodiment, the trenches 141*a* and 141*b* are formed using a conventional lithography and etching process. In one embodiment, the etching process to form the trenches 141*a* and 141*b* (i) is essentially selective to the contact regions 132*a* and 132*b*, and (ii) exposes portions of the contact regions 132*a* and 132*b* to the surrounding ambient through the trenches 141*a* and 141*b*, respectively. In one embodiment, the etching process to form the trenches 141*a* and 141*b* etches through the second low-k dielectric layer 140 and stops at anywhere in the first low-k dielectric layer 130 before the device cap dielectric layer 120 is exposed to the surrounding ambient through the trenches 141*a* and 141*b*.

Figure 1H:
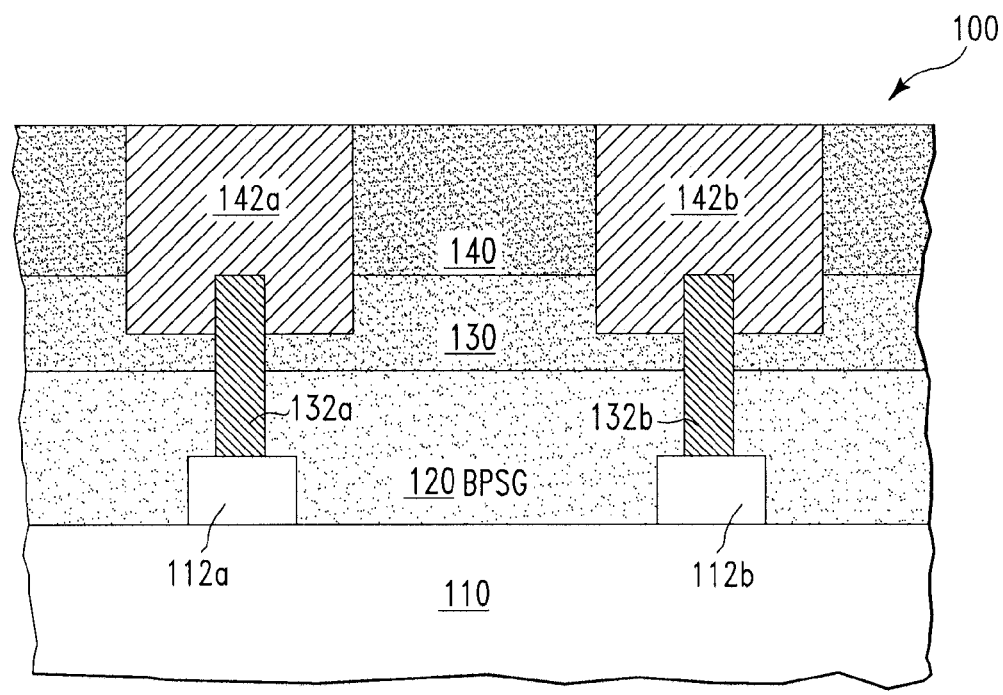

Next, in one embodiment, the trenches 141*a* and 141*b* are filled with a second electrically conductive material so as to form metal lines 142*a* and 142*b*, respectively, resulting in the structure 100 of FIG. 1H. In one embodiment, with reference to FIGS. 1G and 1H, the metal lines 142*a* and 142*b* are formed by depositing the second electrically conductive material on top of the entire structure 100 of FIG. 1G (including in the trenches 141*a* and 141*b*) and then polishing by a CMP step to remove excessive material outside the trenches 141*a* and 141*b*. As a result, the metal lines 142*a* and 142*b* are electrically coupled to the contact regions 132*a* and 132*b*, respectively. In one embodiment, the second electrically conductive material used to form the metal lines 142*a* and 142*b* comprises copper.

Figure 1I:
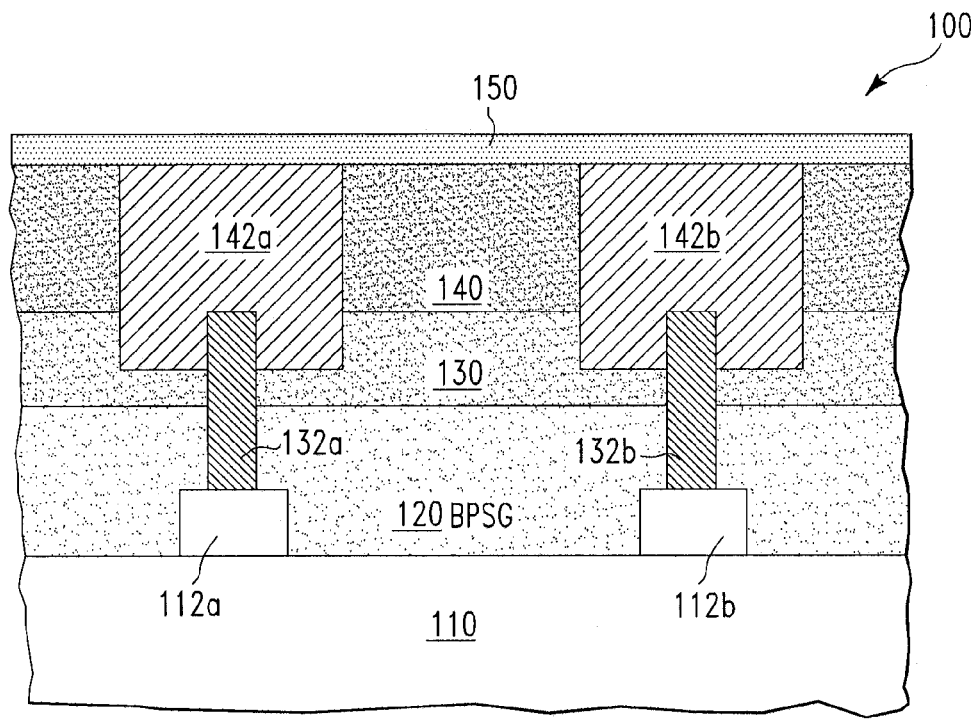

Next, with reference to FIG. 1I, in one embodiment, a first cap layer 150 is formed on top of the entire structure 100 of FIG. 1I. In one embodiment, the first cap layer 150 can be formed by CVD of a dielectric material on top of the entire structure 100 of FIG. 1H. In one embodiment, the first cap layer 150 comprises silicon carbide (SiC), silicon nitride (SiN), and/or silicon carbon nitride (SiCN), etc.

Next, in one embodiment, additional conventional fabrication steps are performed on the structure 100 of FIG. 1I so as to form a final product (not shown).

In the embodiments described above, for simplicity, with reference to FIGS. 1A-1I, the structure 100 comprises only two metal lines 142*a* and 142*b*. In general, the structure 100 can comprise multiple metal lines (similar to the metal lines 142*a* and 142*b* as described in FIGS. 1A-1I) in the first low-k dielectric layer 130 and the second low-k dielectric layer 140.

With reference to FIG. 1I, it should be noted that the higher the density of the multiple metal lines in the first low-k dielectric layer 130 and the second low-k dielectric layer 140, the higher the line-to-line coupling capacitance between the multiple metal lines resulting in lower semiconductor chip speed. It should also be noted that without the presence of the first low-k dielectric layer 130, the two metal lines 142*a* and 142*b* would be in direct physical contact with the device cap dielectric layer 120. As a result, the line-to-line coupling capacitance between the two metal lines 142*a* and 142*b* through the device cap dielectric layer 120 would be high (because BPSG is a high-k dielectric material). With the presence of the first low-k dielectric layer 130, the two metal lines 142*a* and 142*b* are physically separated from the device cap dielectric layer 120 by the first low-k dielectric layer 130. As a result, the line-to-line coupling capacitance between the two metal lines 142*a* and 142*b* through the device cap dielectric layer 120 is reduced. It should be noted that the line-to-line coupling capacitance between the two metal lines 142*a* and 142*b* through the first low-k dielectric layer 130 is small because the first low-k dielectric material used to form the first low-k dielectric layer 130 has a low dielectric constant.

Figure 2:
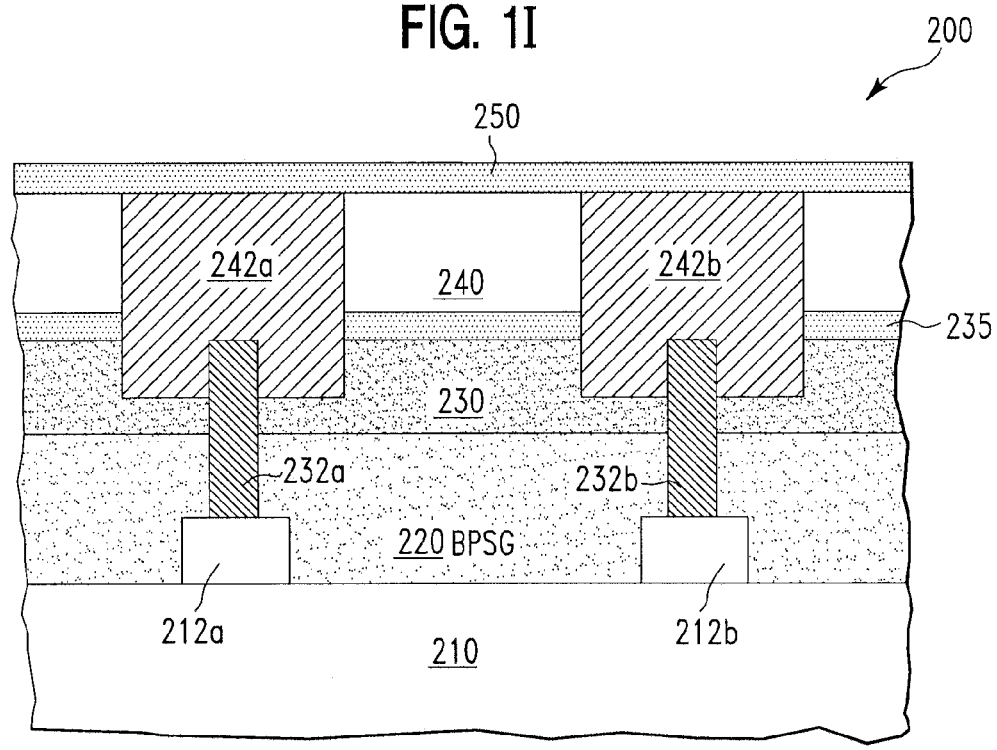
FIG. 2 shows a cross-section view of a second semiconductor structure, in accordance with embodiments of the present invention.

FIG. 2 shows a cross-section view of a second semiconductor structure 200, in accordance with embodiments of the present invention. In one embodiment, the structure 200 of FIG. 2 is similar to the structure 100 of FIG. 1I, except that besides a first cap layer 250, there is a second cap layer 235 which is sandwiched between a first low-k layer 230 and a second low-k layer 240. It should be noted that similar regions and layers of the structure 200 of FIG. 2 and the structure 100 of FIG. 1I have the same reference numerals, except for the first digit which is the same as the figure numbers. For instance, a BPSG layer 220 (FIG. 2) and the device cap dielectric layer 120 (FIG. 11) are similar. In one embodiment, the second cap layer 235 comprises silicon carbide (SiC), silicon nitride (SiN), and/or silicon carbon nitride (SiCN), etc.

It should be noted that with the presence of the first low-k dielectric layer 230 in FIG. 2, two metal lines 242*a* and 242*b* are physically separated from the BPSG layer 220 by the first low-k dielectric layer 230. As a result, the line-to-line coupling capacitance between the two metal lines 242*a* and 242*b* through the BPSG layer 220 is reduced compared with the case, in which the first low-k dielectric layer 230 is omitted. It should be noted that the line-to-line coupling capacitance between the two metal lines 242*a* and 242*b* through the first low-k dielectric layer 230 is small because the first low-k dielectric material used to form the first low-k dielectric layer 230 has a low dielectric constant.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
    (a) a substrate;
    (b) a first device and a second device each being on the substrate;
    (c) a device cap dielectric layer on top of the first and second devices and on top of the substrate, wherein the device cap dielectric layer comprises a device cap dielectric material;

(d) a first dielectric layer on top of the device cap dielectric layer, wherein the first dielectric layer comprises a first dielectric material;

(e) a second dielectric layer on top of the first dielectric layer, wherein the second dielectric layer comprises a second dielectric material; and (f) a first electrically conductive line and a second electrically conductive line each residing in the first and second dielectric layers, wherein the first dielectric layer physically separates the first and second electrically conductive lines from the device cap dielectric layer such that both the first and second electrically conductive lines are not in direct physical contact with the device cap dielectric layer, and wherein a dielectric constant of the first dielectric material is less than a dielectric constant of the device cap dielectric material.

2. The structure of claim 1, wherein a dielectric constant of the second dielectric material is different from the dielectric constant of the first dielectric material.

3. The structure of claim 1, wherein a dielectric constant of the second dielectric material is the same as the dielectric constant of the first dielectric material.

4. The structure of claim 1, wherein the first dielectric material comprises a material selected from the group consisting of FSG (Fluorine-doped Silicate Glass), Bulk SiCOH (carbon-doped silicon oxides), and Porous SiCOH.

5. The structure of claim 1, wherein the first and second electrically conductive lines comprise copper.

6. The structure of claim 1, wherein the device cap dielectric layer comprises BPSG (Boro-Phospho-Silicate Glass).

7. The structure of claim 1, further comprising a first contact region and a second contact region each residing in the device cap dielectric material, wherein the first contact region electrically couples the first electrically conductive line to the first device, and wherein the second contact region electrically couples the second electrically conductive line to the second device.

8. The structure of claim 7, wherein the first and second contact regions comprise tungsten.

9. The structure of claim 1, further comprising a first cap layer, wherein the first cap layer is on top of and in direct physical contact with (i) the first and second electrically conductive lines and (ii) the second dielectric layer.

10. The structure of claim 9, wherein the first cap layer comprises a material selected from the group consisting of silicon carbide (SiC), silicon nitride (SiN), and silicon carbon nitride (SiCN).

11. The structure of claim 9, further comprising a second cap layer, wherein the second cap layer is sandwiched between the first and second dielectric layers.

12. The structure of claim 11, wherein the second cap layer comprises a material selected from the group consisting of silicon carbide (SiC), silicon nitride (SiN), and silicon carbon nitride (SiCN).

13. The structure of claim 1, wherein the first dielectric layer is in direct physical contact with the second dielectric layer.

14. A semiconductor structure fabrication method, comprising:

providing a semiconductor structure which includes:
(a) a substrate,
(b) a first device and a second device each being on the substrate,
(c) a device cap dielectric layer on top of the first and second devices and on top of the substrate, wherein the device cap dielectric layer comprises a device cap dielectric material,
(d) a first dielectric layer on top of the device cap dielectric layer, wherein the first dielectric layer comprises a first dielectric material, and
(e) a second dielectric layer on top of the first dielectric layer, wherein the second dielectric layer comprises a second dielectric material; and forming a first electrically conductive line and a second electrically conductive line each residing in the first and second dielectric layers, wherein the first dielectric layer physically separates the first and second electrically conductive lines from the device cap dielectric layer such that both the first and second electrically conductive lines are not in direct physical contact with the device cap dielectric layer, and wherein a dielectric constant of the first dielectric material is less than a dielectric constant of the device cap dielectric material.

15. The method of claim 14, wherein a dielectric constant of the second dielectric material is different from the dielectric constant of the first dielectric material.

16. The method of claim 14, wherein a dielectric constant of the second dielectric material is the same as the dielectric constant of the first dielectric material.

17. The method of claim 14, wherein the first dielectric material comprises a material selected from the group consisting of FSG (Fluorine-doped Silicate Glass), Bulk SiCOH (carbon-doped silicon oxides), and Porous SiCOH.

18. The method of claim 14, wherein the semiconductor structure further includes a first contact region and a second contact region each residing in the device cap dielectric material, wherein the first contact region electrically couples the first electrically conductive line to the first device, and wherein the second contact region electrically couples the second electrically conductive line to the second device.

19. The method of claim 14, further comprising, after said forming the first and second electrically conductive lines is performed, forming a first cap layer, wherein the first cap layer is on top of and in direct physical contact with (i) the first and second electrically conductive lines and (ii) the second dielectric layer.

20. The method of claim 19, wherein the semiconductor structure further includes a second cap layer, wherein the second cap layer is sandwiched between the first and second dielectric layers.

* * * * *